(12) United States Patent
Chuang et al.

(10) Patent No.: US 8,237,193 B2
(45) Date of Patent: Aug. 7, 2012

(54) LATERAL TRANSIENT VOLTAGE SUPPRESSOR FOR LOW-VOLTAGE APPLICATIONS

(75) Inventors: Che-Hao Chuang, Hsinchu (TW); Kun-Hsien Lin, Hsinchu (TW); Ryan Hsin-Chin Jiang, Taipei (TW)

(73) Assignee: Amazing Microelectronic Corp., Taipei County (TW)

( * ) Notice: Subject to any disclaimer, the term of this patent is extended or adjusted under 35 U.S.C. 154(b) by 153 days.

(21) Appl. No.: 12/837,128

(22) Filed: Jul. 15, 2010

(65) Prior Publication Data

US 2012/0012974 A1    Jan. 19, 2012

(51) Int. Cl.
*H01L 29/06*    (2006.01)
(52) U.S. Cl. .. 257/173; 257/355; 257/510; 257/E29.018
(58) Field of Classification Search .................. 257/173, 257/355, 510, 594, E29.018; 361/91.1, 91.5
See application file for complete search history.

(56) References Cited

U.S. PATENT DOCUMENTS

| | | | |
|---|---|---|---|
| 6,617,650 B1 * | 9/2003 | Chen et al. | 257/355 |
| 6,972,476 B2 | 12/2005 | Chen et al. | |
| 7,235,846 B2 | 6/2007 | Fung | |
| 7,863,110 B2 * | 1/2011 | Yu et al. | 438/140 |
| 7,880,223 B2 * | 2/2011 | Bobde | 257/328 |

OTHER PUBLICATIONS

Chen, Shiao-Shien et al., Low-Leakage Diode String Designs Using Triple-Well Technologies for RF-ESD Applications, IEEE Electron Device Letters, Sep. 2003, pp. 595-597, vol. 24, No. 9.

* cited by examiner

*Primary Examiner* — Tuan N. Quach
(74) *Attorney, Agent, or Firm* — Muncy, Geissler, Olds & Lowe, PLLC

(57) ABSTRACT

A lateral transient voltage suppressor for low-voltage applications. The suppressor includes an N-type heavily doped substrate and at least two clamp diode structures horizontally arranged in the N-type heavily doped substrate. Each clamp diode structure further includes a clamp well arranged in the N-type heavily doped substrate and having a first heavily doped area and a second heavily doped area. The first and second heavily doped areas respectively belong to opposite conductivity types. There is a plurality of deep isolation trenches arranged in the N-type heavily doped substrate and having a depth greater than depth of the clamp well. The deep isolation trenches can separate each clamp well. The present invention avoids the huge leakage current to be suitable for low-voltage application.

16 Claims, 6 Drawing Sheets

LATERAL TRANSIENT VOLTAGE SUPPRESSOR FOR LOW-VOLTAGE APPLICATIONS

BACKGROUND OF THE INVENTION

1. Field of the Invention

The present invention relates to a lateral transient voltage suppressor, particularly to a lateral transient voltage suppressor for low-voltage applications.

2. Description of the Related Art

Because the IC device sizes have been shrunk to nanometer scale, the consumer electronics, like the laptop and mobile devices, have been designed to be much smaller than ever. Without suitable protection devices, the functions of these electronics could be reset or even damaged under ESD (Electrostatic Discharge) events. Currently, all consumer electronics are expected to pass the ESD test requirement of IEC 61000-4-2 standard. TVS (Transient Voltage Suppressor) is generally designed to bypass the ESD energy, so that the electronic systems can be prevented from ESD damages. The working principle of TVS is shown in FIG. 1. In FIG. 1, the TVS devices 10 are connected in parallel with the protected circuits 12 on the PCB (Printed Circuit Board). These TVS devices 10 would be triggered immediately when the ESD event is occurred. In that way, each TVS device 10 can provide a superiorly low resistance path for discharging the transient ESD current, so that the energy of the ESD transient current can be bypassed by the TVS devices 10.

For advanced interface applications, such as Ethernet, LVDS . . . , etc, the signal swing or power supply voltage is lower than 2.5V. FIG. 2 shows the schematic of tradition TVS with zener diode 14. The turned-on voltage of TVS in FIG. 2 is decided by the breakdown voltage of zener diode 14. However, the traditional zener breakdown voltage of TVS is around 6V~10V, which is higher than the breakdown voltage of the device to be protected. When ESD event is occurred, the device to be protected will breakdown first and damaged before TVS turned-on. Therefore, the turned-on voltage of TVS has to be reduced for under 2.5V application.

The traditional method to reduce breakdown voltage is adjusted the p-n junction dosage of zener diode 14. However, the leakage current will be huge if the breakdown voltage is adjusted to around 3V because the very heavy dosage of p-n junction. FIG. 3 shows another method that diodes 16 in series are used to instead of zener diode between Vcc and GND. The forward cut-in voltage of one diode 16 is around 0.7V. In ideal the turned-on voltage of TVS is n*0.7V when n diodes 16 in series. However, from FIG. 4 and FIG. 5, it is known that the more the number of the transistors cascaded to each other, the larger the leakage current due to the parasitic PNP formed by P-type substrate 20 and each N-type doped well 22. This phenomenon is the Darlington effect. The turned-on voltage of n diodes 16 in series is much lower than n*0.7V and leakage current is huge in CMOS process because the Darlington effect in FIG. 3.

To overcome the abovementioned problems, the present invention provides a lateral transient voltage suppressor for low-voltage applications, so as to solve the afore-mentioned problems of the prior art.

SUMMARY OF THE INVENTION

A primary objective of the present invention is to provide a lateral transient voltage suppressor, which adopts deep isolation trenches to separate each doped well arranged in the substrate, whereby the suppressor is suitable for low-voltage application and the huge leakage current isn't generated.

To achieve the abovementioned objectives, the present invention provides a lateral transient voltage suppressor for low-voltage applications, which comprises an N-type heavily doped substrate and at least two clamp diode structures horizontally arranged in the N-type heavily doped substrate. Each clamp diode structure further comprises a clamp well arranged in the N-type heavily doped substrate and having a first heavily doped area and a second heavily doped area. The first and second heavily doped areas respectively belong to opposite conductivity types. There is a plurality of deep isolation trenches arranged in the N-type heavily doped substrate and having a depth greater than depth of the clamp well. The deep isolation trenches can separate each clamp well.

Below, the embodiments are described in detail in cooperation with the drawings to make easily understood the technical contents, characteristics and accomplishments of the present invention.

DETAILED DESCRIPTION OF THE INVENTION

Figure 1:
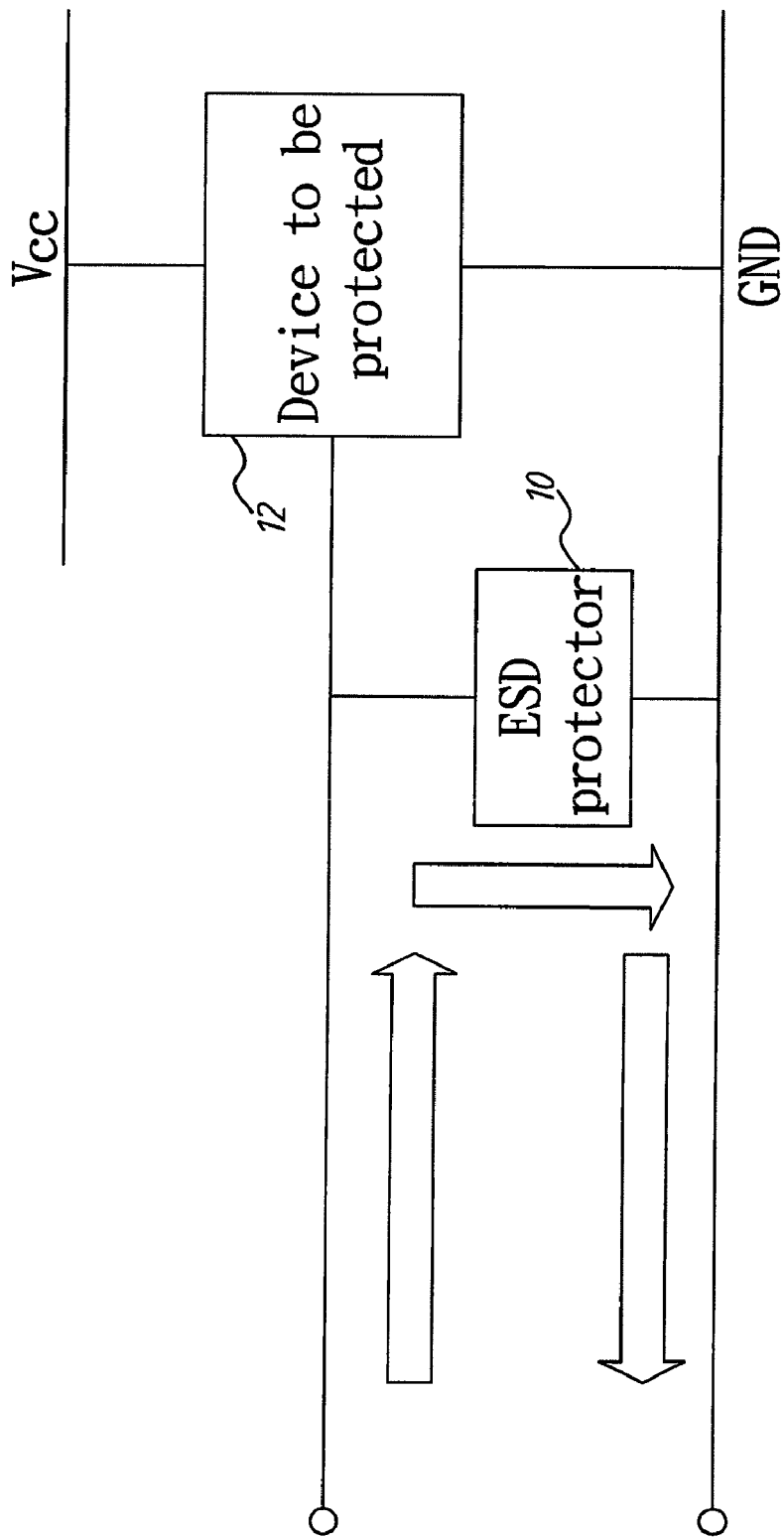
FIG. 1 is a circuit diagram showing a transient voltage suppressor connected with a protected circuit according to the prior art.
Figure 3:
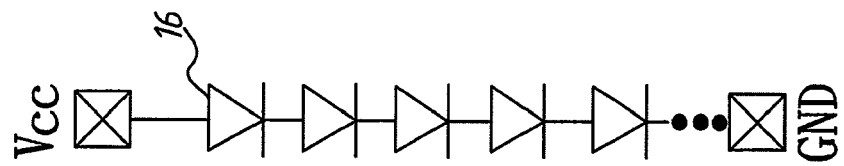
FIG. 3 is a circuit diagram showing the transient voltage suppressor with a plurality of diodes between a low and high voltage according to the prior art.
Figure 2:
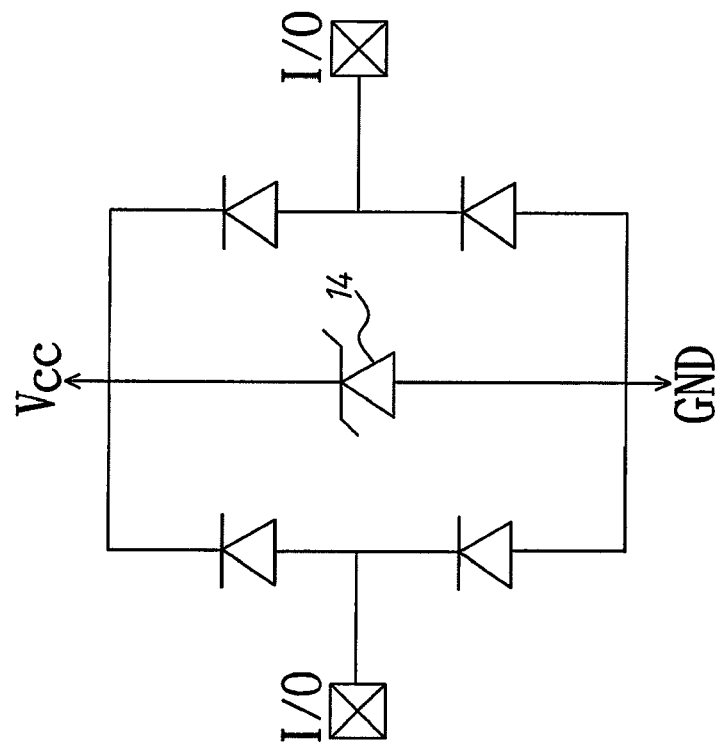
FIG. 2 is a circuit diagram showing the transient voltage suppressor with a zener diode between a low and high voltage according to the prior art.
Figures 4, 5:
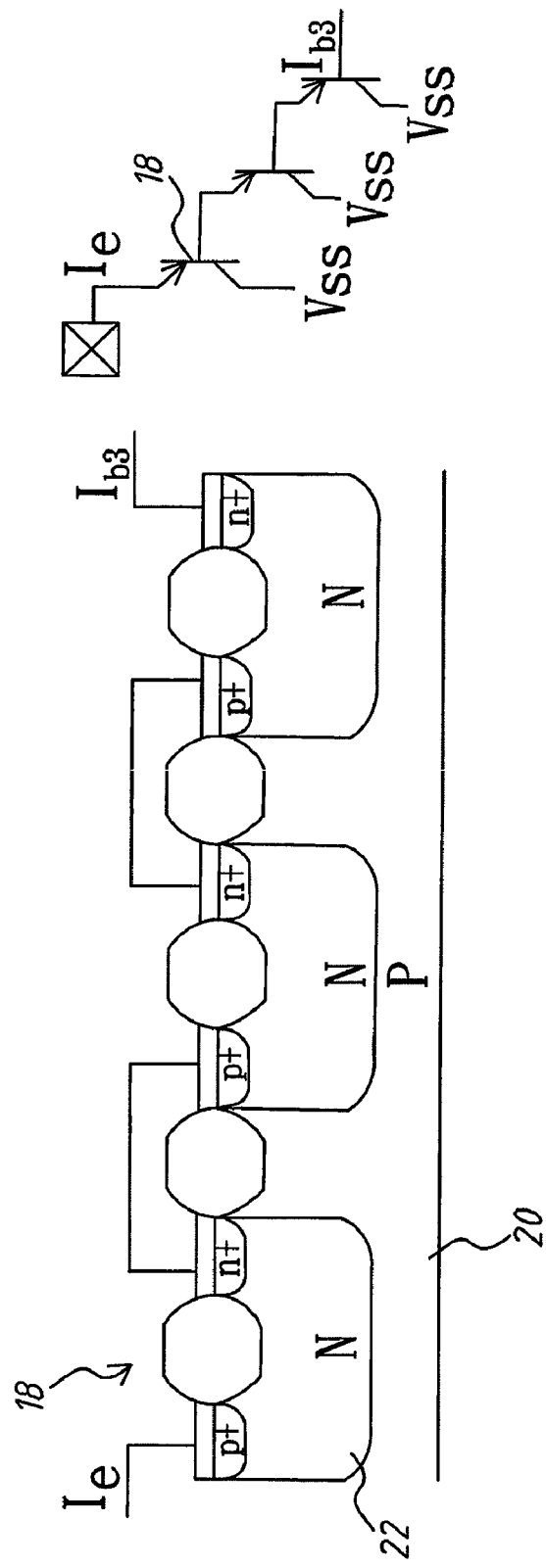
FIG. 4 is a sectional view schematically showing a plurality of transistors cascaded to each other according to the prior art.
FIG. 5 is a circuit diagram showing a plurality of transistors cascaded to each other according to the prior art.
Figure 7:
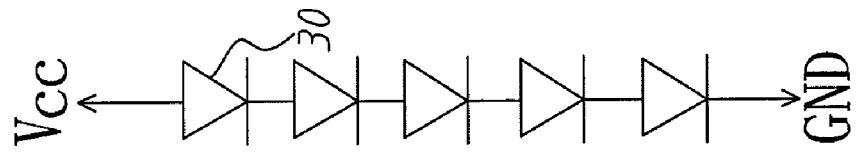
FIG. 7 is a circuit diagram showing the transient voltage suppressor according to the first embodiment of the present invention.
Figure 6:
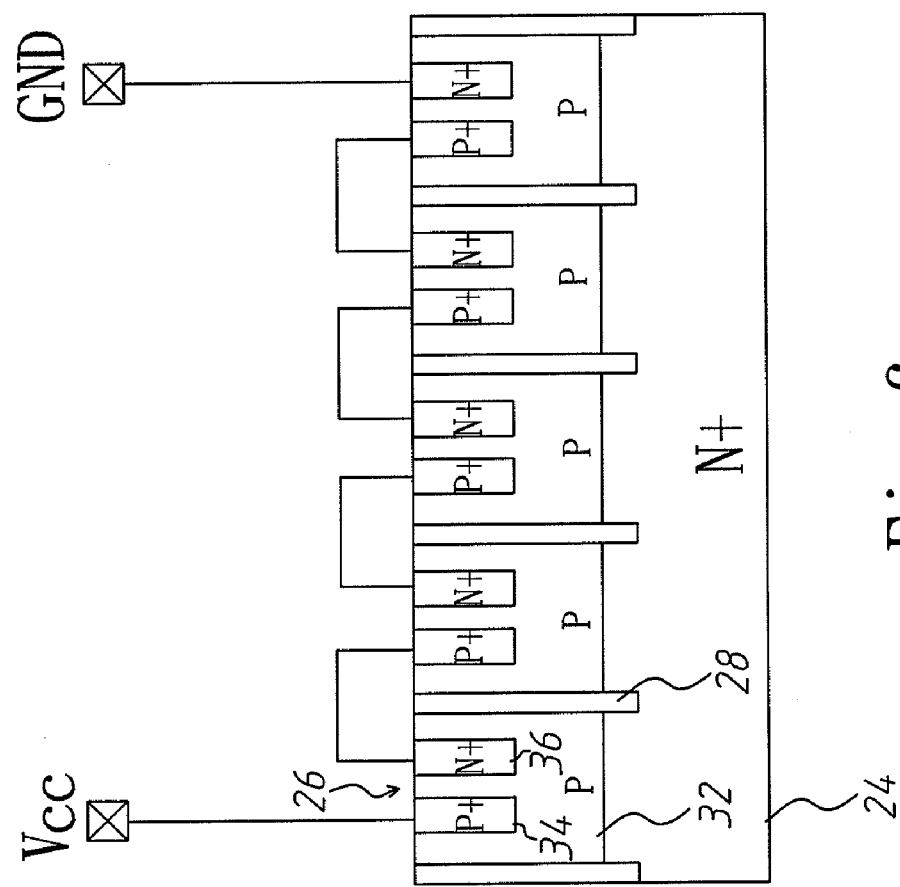
FIG. 6 is a sectional view schematically showing a transient voltage suppressor according to the first embodiment of the present invention.

Refer to FIG. 6 and FIG. 7, wherein FIG. 7 is an equivalent circuit of FIG. 6. The transient voltage suppressor (TVS) of the present invention comprises an N-type heavily doped substrate 24, at least two clamp diode structures 26 horizontally arranged in the N-type heavily doped substrate 24 and clustering together, and a plurality of deep isolation trenches 28 comprising dielectric material. The N-type heavily doped substrate 24 is used to avoid latch-up issue in the present invention. In the first embodiment, the number of the clamp diode structure 26 is five, which is used as an example. The clamp diode structure 26 is the semiconductor structure of the diode 30. Each clamp diode structure 26 further comprises a clamp well 32 arranged in the N-type heavily doped substrate 24 and having a first heavily doped area 34 and a second heavily doped area 36. The semiconductor conductivity type is either P-type or N-type. The first and second heavily doped areas 34 and 36 respectively belong to opposite conductivity le;.5qtypes. The clamp wells 32 are connected in series via the first and second heavily doped areas 34 and 36. In the first embodiment, for example, the clamp well 32 is P-type clamp well, the first heavily doped area 34 is P-type heavily doped area, and the second heavily doped area 36 is N-type heavily doped area. The first one of the clamp well 32 is regard as the left most clamp well 32. The last one of the clamp well 32 is regard as the most right clamp well 32. The first heavily doped area 34 of the first one of the clamp well 32 is connected with a high voltage, such as Vcc voltage. The second heavily doped area 36 of the last one of the clamp well 32 is connected with a low voltage, such as grounding voltage. Then, the first and second heavily doped areas 34 and 36 are biased. Besides, the N-type heavily doped substrate 24 is in a floating state or connected with the Vcc voltage lest the leakage current be occurred.

The deep isolation trenches 28 arranged in the N-type heavily doped substrate 24 have a depth greater than depth of the clamp well 32. A deep isolation trench 28 located between the two neighboring clamp well 32 is adjacent to them. As a result, the deep isolation trenches 28 can separate each clamp well 32.

When the suppressor is biased, the electrostatic discharge (ESD) current flowing these clamp wells 32 is a lateral path. The Darlington effect for the clamp diode structures 26 is not occurred in this structure. Generally speaking, the turned-on voltage is around 3.5 V when 5 diodes 30 in series, which is suitable for 2.5 V application. For lower operating voltage, such as 1.8 V application, the number of diodes 30 in series can be reduced. Therefore, the present invention can avoid the huge leakage current to be suitable for low-voltage application.

The first embodiment is shown by another type. When the clamp well 32 is an N-type clamp well, the first heavily doped area 34 and the second heavily doped area 36 are respectively an N-type heavily doped area and a P-type heavily doped area. And then, the first heavily doped area 34 of the first one of the clamp well 32 is connected with the low voltage, such as the grounding voltage. The second heavily doped area 36 of the last one of the clamp well 32 is connected with the high voltage, such as the Vcc voltage. Then, the first and second heavily doped areas 34 and 36 are biased.

Figure 8:
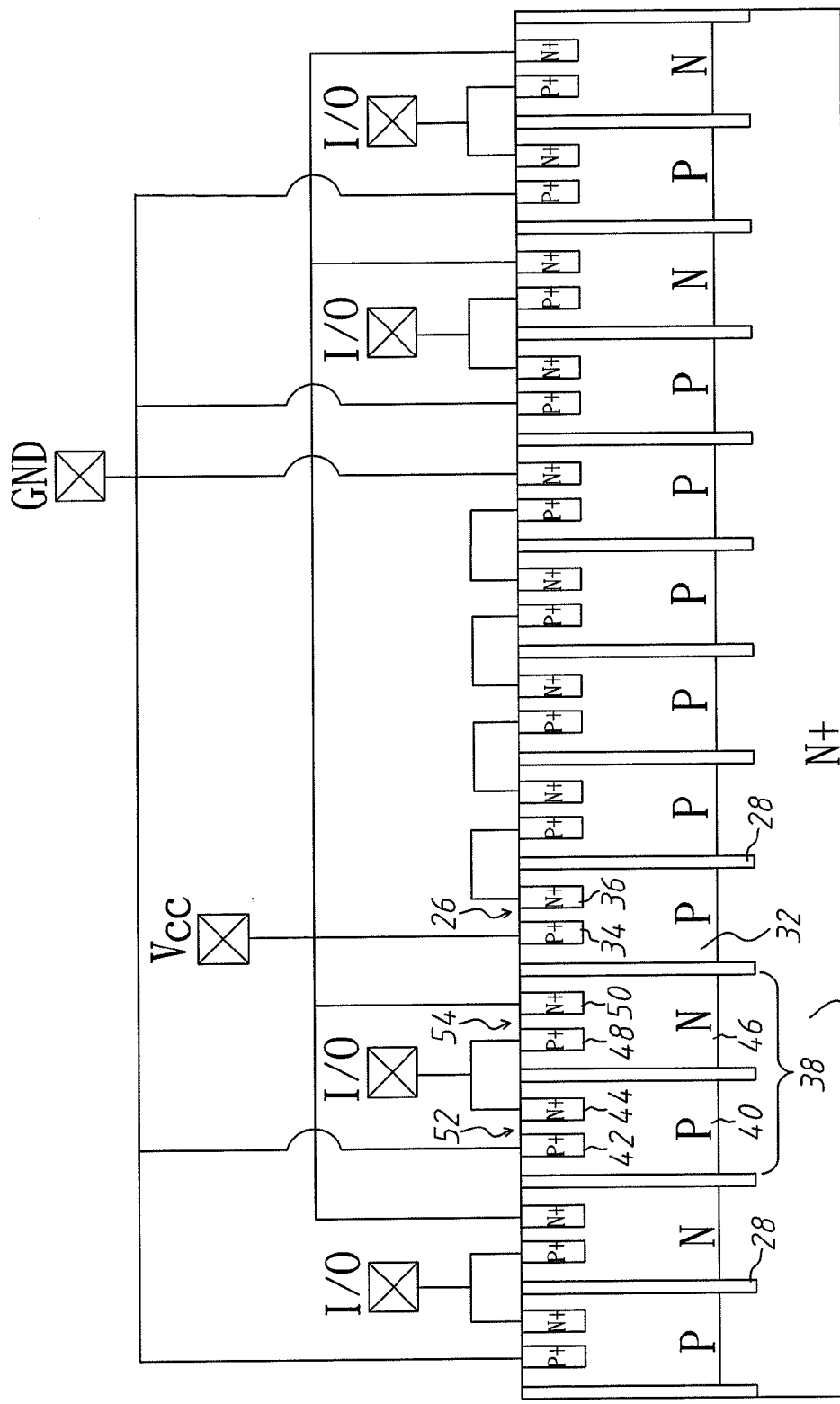
FIG. 8 is a sectional view schematically showing a transient voltage suppressor according to the second embodiment of the present invention.
Figure 9:
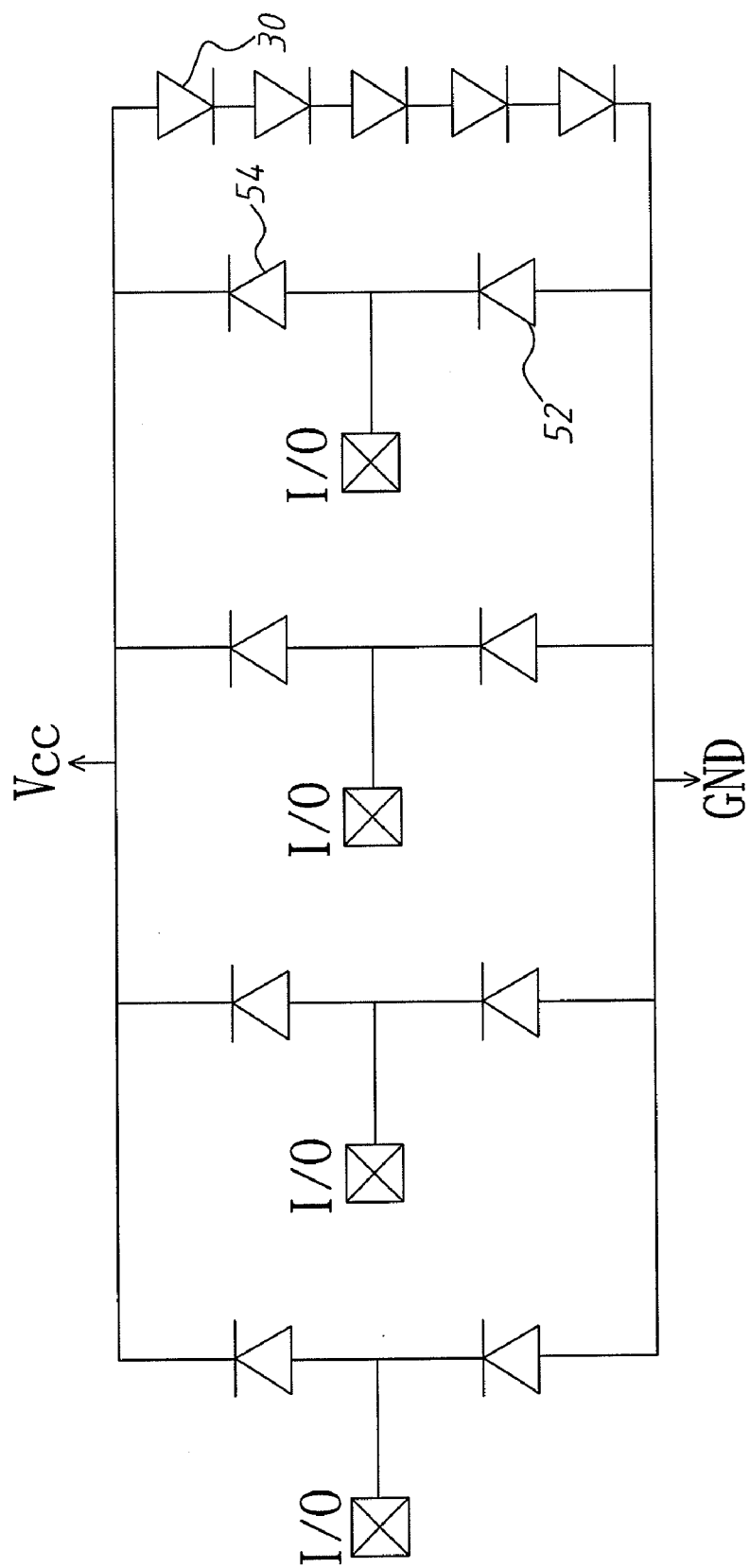
FIG. 9 is a circuit diagram showing the transient voltage suppressor according to the second embodiment of the present invention.

The second embodiment is introduced as below. Refer to FIG. 8 and FIG. 9, wherein FIG. 9 is equivalent circuit of FIG. 8. FIG. 9 shows the TVS with multiple channels. The second embodiment is different from the first embodiment in that there is at least one diode cascade-diode structure 38 horizontally arranged in the N-type heavily doped substrate 24 and neighboring the clamp diode structures 26. In such a case, the number of the diode cascade-diode structure 38 is four, which is used as an example. The diode cascade-diode structures not only neighbor the clamp diode structures 26 but cluster together. Each diode cascade-diode structure 38 comprises a first well 40 having a third heavily doped area 42 and a fourth heavily doped area 44, and a second well 46 having a fifth heavily doped area 48 and a sixth heavily doped area 50. A first diode 52 is formed by the first well 40, the third heavily doped area 42, and the fourth heavily doped area 44. A second diode 54 is formed by the second well 46, the fifth heavily doped area 48, and the sixth heavily doped area 50.

The first well 40 is arranged in the N-type heavily doped substrate 24, wherein the first well 40 and the clamp well 32 belong to the same conductivity type, and wherein the third and fourth heavily doped areas 42 and 44 are both arranged in the first well 40 and respectively belong to opposite conductivity types. The third heavily doped area 42 and the first well 40 belong to the same conductivity type, and the fourth heavily doped area 44 and the second well 44 belong the same conductivity type. In such a case, for instance, the first well 40 is a P-type well; the third heavily doped area 42 is a P-type heavily doped area; and the fourth heavily doped area 44 is an N-type heavily doped area.

The second well 46 arranged in the N-type heavily doped substrate neighbors the first well 40. The second well 46 has a fifth heavily doped area 48 and a sixth heavily doped area 50, wherein the second well 46 and the first well 40 respectively belong to opposite conductivity types. The fifth and sixth heavily doped wells 48 and 50 are both arranged in the second well 46 and respectively belong to opposite conductivity types. The fifth heavily doped area 48 and the third heavily doped area 42 belong the same type, and the sixth heavily doped area 50 and the fourth heavily doped area 44 belong to the same conductivity type. The fourth and fifth heavily doped areas 44 and 48 respectively belong to opposite conductivity types. The first heavily doped area 34 and the fifth heavily doped area 48 belong to the same type, and the second heavily doped area 36 and the sixth heavily doped area 50 belong to the same type. In such a case, for example, the second well 46 is an N-type well; the fifth heavily doped area 48 is a P-type heavily doped area; and the sixth heavily doped area 50 is an N-type heavily doped area. As the above-mentioned, the first heavily doped area 34 is a P-type heavily doped area; and the second heavily doped area 36 is an N-type heavily doped area. The fourth and fifth heavily doped areas 44 and 48 are both connected with an I/O pin.

The first heavily doped area 34 of the first one of the clamp well 32 and each sixth heavily doped area 50 are connected with a high voltage, such as Vcc voltage. The second heavily doped area 36 of the last one of the clamp well 32 and each third heavily doped area 42 are connected with a low voltage, such as grounding voltage. Then, the all heavily doped areas are biased. Besides, the N-type heavily doped substrate 24 is in a floating state or connected with the Vcc voltage lest the leakage current be occurred.

The depth of the deep isolation trenches 28 is also greater than the depth of the first well 40 and the second well 46. In addition, a deep isolation trench 28 located between the two neighboring diode cascade-diode structures 38 is adjacent to them. And, a deep isolation trench 28 is located between the diode cascade-diode structure 38 and the clamp well 32 most near to it but also adjacent to them. A deep isolation trench 28 located between the two neighboring the first and second well 40 and 46 is adjacent to them. As a result, the deep isolation trenches 28 can separate the first well 40, the second well 46 and the clamp well 32 adjacent thereto. Also, the cascade-diode structures 38 are respectively isolated by the deep isolation trenches 28.

Similarly to the first embodiment, when the suppressor is biased, the ESD current flowing the clamp wells 32, the first wells 40, and the second wells 46 is a lateral path. The Darlington effect for the clamp diode structures 26 is not occurred in this structure. The suppressor is also suitable for low-voltage application.

The second embodiment is shown by another type. When the clamp well 32 is an N-type clamp well, the first heavily doped area 34 and the second heavily doped area 36 are respectively an N-type heavily doped area and a P-type heavily doped area. And then, the first and second wells 40 and 46 are respectively an N-type well and a P-type well; the third and fourth heavily doped areas 42 and 44 are respectively an N-type heavily doped area and P-type heavily doped area; and the fifth and sixth heavily doped areas 48 and 50 are respectively an N-type heavily doped area and P-type heavily doped area. As to the connection relation of voltage, the first heavily doped area 34 of the first one of the clamp well 32 and each sixth heavily doped area 50 are connected with the low voltage, such as the grounding voltage. The second heavily doped area 36 of the last one of the clamp well 32 and each third heavily doped area 42 are connected with the high voltage, such as the Vcc voltage. Then, the all heavily doped areas are biased.

In conclusion, the deep isolation trenches are arranged in the substrate so that each well is isolated. Therefore, the suppressor of the present invention is quite suitable for low-voltage application.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A lateral transient voltage suppressor for low-voltage applications, comprising
   an N-type heavily doped substrate;
   at least two clamp diode structures horizontally arranged in said N-type heavily doped substrate, wherein each said clamp diode structure further comprises
      a clamp well arranged in said N-type heavily doped substrate and having a first heavily doped area and a second heavily doped area, wherein said first and second heavily doped areas respectively belong to opposite conductivity types; and
   a plurality of deep isolation trenches arranged in said N-type heavily doped substrate, having a depth greater than depth of said clamp well, but less than the depth of the N-type heavily doped substrate, and separating each said clamp well.

2. The lateral transient voltage suppressor for low-voltage applications according to claim 1, further comprising at least one cascade-diode structure arranged in said heavily doped N-type substrate and neighboring said clamp diode structures, wherein said cascade-diode structure further comprises:
   a first well arranged in said N-type heavily doped substrate and having a third heavily doped area and a fourth heavily doped area, wherein said first well and said clamp well belong to a same conductivity type, and wherein said third and fourth heavily doped areas are both arranged in said first well and respectively belong to opposite conductivity types; and
   a second well arranged in said N-type heavily doped substrate, neighboring said first well and having a fifth heavily doped area and a sixth heavily doped area, wherein said second well and said first well respectively belong to opposite conductivity types, and wherein said fifth and sixth heavily doped areas are both arranged in said second well and respectively belong to opposite conductivity types, and wherein said fourth and fifth heavily doped areas are connected and respectively belong to opposite conductivity types, and wherein said depth of said deep isolation trenches is greater than said depths of said first well and said second well, said deep isolation trenches separating said first well from said second well and separating said cascade-diode structure from said clamp well adjacent thereto.

3. The lateral transient voltage suppressor for low-voltage applications according to claim 2, wherein said fourth and fifth heavily doped areas of said cascade-diode structure are connected with an I/O pin.

4. The lateral transient voltage suppressor for low-voltage applications according to claim 2, wherein there is a plurality of said cascade-diode structures, said cascade-diode structures are horizontally arranged in said N-type heavily doped substrate and respectively isolated by said deep isolation trenches.

5. The lateral transient voltage suppressor for low-voltage applications according to claim 2, wherein said third heavily doped area and said first well belong to a same conductivity type, and wherein said fourth heavily doped area and said second well belong a same conductivity type, and wherein said fifth heavily doped area and said third heavily doped area belong a same conductivity type, and wherein said sixth heavily doped area and said fourth heavily doped area belong to a same conductivity type, and wherein said first heavily doped area and said fifth heavily doped area belong to a same conductivity type, and wherein said second heavily doped area and said sixth heavily doped area belong to a same conductivity type.

6. The lateral transient voltage suppressor for low-voltage applications according to claim 2, wherein when said first well and said clamp well are respectively a P-type well and a P-type clamp well, said second well is an N-type well.

7. The lateral transient voltage suppressor for low-voltage applications according to claim 6, wherein said third heavily doped area and said second heavily doped area of a last one of said clamp wells are connected with a low voltage, and wherein said sixth heavily doped area and said first heavily doped area of a first one of said clamp wells are connected with a high voltage, whereby said first and second heavily doped areas are biased.

8. The lateral transient voltage suppressor for low-voltage applications according to claim 7, wherein said low voltage is a grounding voltage.

9. The lateral transient voltage suppressor for low-voltage applications according to claim 7, wherein said N-type heavily doped substrate is in a floating state or connected with said high voltage.

10. The lateral transient voltage suppressor for low-voltage applications according to claim 2, wherein when said first well and said clamp well are respectively an N-type well and an N-type clamp well, said second well is a P-type well.

11. The lateral transient voltage suppressor for low-voltage applications according to claim 10, wherein said third heavily doped area and said second heavily doped area of a last one of said clamp wells are connected with a high voltage, and wherein said sixth heavily doped area and said first heavily doped area of a first one of said clamp wells are connected with a low voltage, whereby said first and second heavily doped areas are biased.

12. The lateral transient voltage suppressor for low-voltage applications according to claim 11, wherein said low voltage is a grounding voltage.

13. The lateral transient voltage suppressor for low-voltage applications according to claim 11, wherein said N-type heavily doped substrate is in a floating state or connected with said high voltage.

14. The lateral transient voltage suppressor for low-voltage applications according to claim 2, wherein each of said first wells, said second wells and said clamp wells is adjacent to said deep isolation trenches neighboring thereto.

15. The lateral transient voltage suppressor for low-voltage applications according to claim 1, wherein said clamp wells are connected in series via said first and second heavily doped areas.

16. The lateral transient voltage suppressor for low-voltage applications according to claim 1, wherein said deep isolation trenches comprise a dielectric material.

* * * * *